United States Patent [19]
Fairbanks et al.

[11] Patent Number: 5,420,510
[45] Date of Patent: May 30, 1995

[54] SUPPRESSION OF OSCILLATIONS IN NMR MEASUREMENT USING OFF-RESONANCE SPIN-LOCKING PULSES

[75] Inventors: Ethan J. Fairbanks, Middleton; Giles E. Santyr, Monona; James A. Sorenson, Madison, all of Wis.

[73] Assignee: Wisconsin Alumni Research Foundation, Madison, Wis.

[21] Appl. No.: 106,169

[22] Filed: Aug. 13, 1993

[51] Int. Cl.$^6$ .......................................... G01R 33/20
[52] U.S. Cl. ..................................... 324/309; 324/300
[58] Field of Search ...................... 324/300, 307, 309; 128/653.2

[56] References Cited

U.S. PATENT DOCUMENTS

| | | | |
|---|---|---|---|
| 4,742,303 | 5/1988 | Bendall | 324/309 |
| 4,820,983 | 4/1989 | Bendall | 324/309 |
| 4,887,034 | 12/1989 | Smith | 324/307 |
| 5,001,427 | 3/1991 | Fujiwara | 324/307 |
| 5,281,917 | 1/1994 | Santyr | 324/309 |

OTHER PUBLICATIONS

Time Saving in Measurement of NMR and EPR Relaxation Times*, *The Review of Science Instruments,* vol. 41, No. 2, pp. 250–251, Feb. 1970, D. C. Look & D. R. Locker.

A Comparison of One–Shot and Recovery Methods in T1 Imaging, *Magnetic Resonance in Medicine* 7, 23–24 (1988) A. P. Crawley & R. M. Henkelman.

*Primary Examiner*—Kenneth A. Wieder
*Assistant Examiner*—Raymond Y. Mah
*Attorney, Agent, or Firm*—Quarles & Brady

[57] ABSTRACT

Oscillations in longitudinal magnetization as a spin system recovers from a 180° inversion pulse in the presence of off-resonance spin-locking pulse are eliminated by tipping the magnetization prior to spin-locking by an amount $\theta$ and tipping it back by an amount $-\theta$ after spin-locking. A one-shot measurement of off-resonance relaxation constant $T_{1\rho}$ employs the $\pm\theta$ pulses to improve accuracy and a $T_{1\rho}$ enhanced imaging sequence employs the $\pm\theta$ pulses to reduce artifacts.

7 Claims, 4 Drawing Sheets

SUPPRESSION OF OSCILLATIONS IN NMR MEASUREMENT USING OFF-RESONANCE SPIN-LOCKING PULSES

BACKGROUND OF THE INVENTION

The field of the invention is nuclear magnetic resonance imaging methods and systems. More particularly, the invention relates to the enhancement of NMR images using off-resonance spin-locking pulses.

Cancer is the leading cause of death among women aged 35 to 50 in the United States, and breast cancer is the most common malignancy in this age group. It is estimated that the average American woman run a 1 in 9 chance of developing breast cancer in her lifetime. The American Cancer Society projects that about 175,000 U.S. women will be diagnosed with breast cancer this year, and 44,500 will die from the disease. Although some controversy persists, it is generally agreed that early detection of breast cancer using X-ray mammography can significantly reduce morbidity. Unfortunately, conventional X-ray mammography often fails to detect breast cancer because of limited tissue contrast particularly in women with predominantly fibro-glandular breasts (often younger women) that are not easily penetrated by X-rays. A further draw-back of X-ray mammography is the presence of ionizing radiation which poses some health risk and is unacceptable to many patients.

Even if breast lesion is detected with X-ray mammography, it is often difficult to confirm that the lesion actually represents cancer because of overlap in mammographic appearance between malignant lesions and a variety of benign lesions including fibroadenomas, necrotic fat and post-operative scarring. Currently, surgical biopsy is the only accurate way to determine the malignant or benign basis of a mammographic finding, however many biopsies are performed on what turn out to be benign lesions. In the United States, the number of cancers diagnosed per number of surgical biopsies performed is only about 20%. This means that approximately 8 out of every 10 surgical biopsies performed on the basis of mammographic or other evidence are 'unnecessary'. Once diagnosed, effective treatment of breast cancer requires accurate localization of breast lesions in order to spare as much normal breast tissue as possible. Conventional X-ray mammography does not provide complete three-dimensional visualization of the breast and is not always sufficient to confirm the presence of multiple lesions. Clearly, alternative breast imaging methods are required in addition to X-ray mammography in order to improve detection, diagnosis and treatment of breast cancer.

Nuclear magnetic resonance (NMR) imaging is a useful adjunct to conventional X-ray mammography. NMR provides multiplanar cross-sectional images with exquisite soft tissue contrast from any view without the ionizing radiation associated with X-ray imaging.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant g of the nucleus). Nuclei which exhibit this phenomena are referred to herein as "spins".

When a substance such as human tissue is subjected to a uniform magnetic field (polarizing field Be), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T^*_2}$$

The decay constant $1/T^*_2$ depends on the homogeneity of the magnetic filed and on $T_2$, which is referred to as the "spin-spin relaxation" constant, or the "transverse relaxation constant." The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements." Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

The present invention will be described in detail with reference to a variant of the well known Fourier transform (FT) imaging technique, which is frequently referred to as "spin-warp". The spin-warp technique is discussed in an article entitled "Spin Warp NMR Imaging and Applications to Human Whole-Body Imaging" by W.A. Edelstein et al., *Physics in Medicine and Biology*, Vol. 25, pp. 751-756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

Numerous strategies are employed to enhance the contrast of various tissues in medical images reconstructed from NMR data. Such strategies usually take advantage of the fact that different tissue types exhibit different $T_1$ and/or $T_2$ (and $T^*_2$) relaxation times. For example, to suppress the signal produced by fat tissues, it is common practice to precede the NMR pulse sequence with an inversion RF pulse followed by a recovery time (TI) as described by Bydder et al *JCAT* 3, 251-254 (1985). By judiciously selecting the recovery time TI, the spins in fat tissue produce little transverse magnetization in the subsequent NMR pulse sequence, and therefore, little signal in the acquired NMR data. As a result, the fat tissues appear less bright in the reconstructed image and other tissues dominate the image. Such fat suppression techniques are essential in the imaging of some organs such as the breast, which have a high fat content. To diagnose many diseases it is necessary to provide medical images which contrast other tissue types. For example, in the imaging of the breast it is important to provide contrast between normal fibro-glandular tissue and breast tumors. This is particularly a problem in younger women with more glandular breasts on whom mammography is often inconclusive. One reason for this lack of contrast is that the $T_1$ relaxation times of fibro-glandular tissue and tumor tissue are nearly the same and this parameter cannot, therefore, be used as a contrast enhancing mechanism as with fat. Contrast agents such as Gadolinium may be injected into the subject shortly before the scan to shorten the $T_1$ of tumor cells and provide a contrast mechanism, but this is a costly, invasive procedure that cannot be used on all patients and the timing of the injection is critical if maximum contrast is to be achieved.

Spin locking is an NMR experiment in which the equilibrium magnetization established by the polarizing magnetic field is rotated by a 90° RF excitation pulse into the transverse plane and "locked" by the application of a much weaker rf field. In the rotating frame of reference and in the absence of spatial encoding gradients, spins are subject to an effective rf field $$H_{eff} = \Delta z + H_1 y, \qquad (1)$$

where the resonance offset, $\Delta z = H_0 - \omega/Y$ is the magnitude of the static polarizing magnetic field in the direction z, Y is the gyromagnetic ratio, and H1 is the magnitude of the rf field in the direction y as shown in FIG. 3A. If the rf field is applied on resonance, the magnetization in the rotating frame, $M_0$, is perturbed only by the applied rf field, $H_1$. The transverse magnetization remains in phase along the direction of $H_1$ and relaxes with time constant $T_{1\rho}$. At the end of the locking interval, the magnetization relaxes as a normal free induction decay (FID) as shown in FIG. 3B. One of the difficulties in applying this experiment to an imaging scan is that the RF locking field requires high power when used with the large polarizing magnetic fields employed with NMR imaging systems. This is difficult to achieve and it exceeds the SAR limits imposed on human subjects.

The same type of experiment can also be performed off resonance ($\Delta > H_1$). During the application of the off resonance field pulse, the equilibrium magnetization $M_0$ relaxes along the effective field $\Delta$ inclined by an angle $\theta$ to the transverse plane. The off-resonance technique measures a relaxation time, $T^{ff}$, which contains contributions from both the rotating frame and laboratory frame spin-lattice relaxation time, $T_1$ and $T_1$, respectively. This technique enables $T_{1\rho}$ information to be obtained without the large rf field strengths required for spin locking on resonance. As described in articles by G. E. Santyr et al entitle "Spin Locking for Magnetic Resonance Imaging with Application to Human Breast," *Magnetic Resonance In Medicine*, 12, 25-37 (1989) and "Off Resonance Field Pulsing For Contrast Manipulation in MRI Application to Human Breast Tissues," Proceedings of the SMRM, San Francisco (1988), the $T_{1\rho}$ spin-lattice relaxation time can be used to distinguish breast tumors from other breast tissues.

As described in copending U.S. application No. 07/925,725 filed on Aug. 5, 1992 and entitled "Off-Resonance Spin-Locking For Enhanced Tumor Contrast In NMR Imaging", now U.S. Pat. No. 5,281,917 the off-resonance spin-locking measurement can be used prior to an MRI imaging pulse sequence to enhance the contrast between breast tumors and normal tissues. A 180° inversion recovery pulse is applied and an off-resonance spin-locking rf pulse is applied for a period TSL during the inversion recovery period TI prior to the imaging pulse sequence. The length (TSL) of the spin-lock RF pulse, its resonance offset $\Delta$ (in units of Hz), and its amplitude, referred to as $f_1$ (where $f_1 = YB_1/2\pi$ in units of Hz), are parameters which determine how well the $T_{1\rho}$ spin-lattice relaxation time is exploited to improve image contrast.

To optimize the contrast provided by the off-resonance spin-lock pulse associated with the inversion recovery pulse, it is necessary to know the time constant $T_{1\rho}$ for the particular tissues being imaged. While rapid measurements of $T_1$ are known, such as that proposed by Look and Locker in *The Review of Scientific Instruments*, Vol. 41, No. 2, pp. 250–51, February 1970, no such measurement of $T_{1\rho}$ has been proposed. Instead, the conventional method of measuring $T_{1\rho}$ is used and may require an hour or more to perform. Clearly, such a measurement cannot be employed as part of a patient scan in a clinical setting because it takes too long. Thus, a "typical" time constant $T_{1\rho}$ is presumed for all patients, and based on this assumption, the parameters of the off-resonance spin-lock pulse are selected.

Another difficulty with using an off-resonance spin-lock pulse to enhance image contrast is that oscillations occur in the longitudinal magnetization as it recovers from the 180° inversion pulse. These oscillations are inconsequential when the spin-lock pulse is far off-resonance, but when the amount of off-resonance $\Delta$ is reduced, they become large. This is illustrated by the solid graph in FIG. 4 for the typical off-resonance spin-lock pulse used to maximize contrast in breast tissues. These oscillations cause artifacts in images and lead to inaccurate $T_{1\rho}$ measurements.

SUMMARY OF THE INVENTION

The present invention relates to a rapid, one-shot method for measuring the off-resonance relaxation time $T_{1\rho}$ and a method for eliminating oscillations in the longitudinal magnetization following the application of an off-resonance spin-locking pulse. More specifically, the present invention includes applying an on-resonance rf pulse to tip the longitudinal magnetization by an amount $\theta = \tan^{-1}(f_1/\Delta)$ prior to application of an off-resonance spin-locking pulse of amplitude $F_1$ and frequency offset $\Delta$, subsequently applying an on-resonance rf pulse to tip the longitudinal magnetization back by an amount $-\theta$, and sampling the longitudinal magnetization by applying an on-resonance excitation pulse to produce transverse magnetization and acquiring the NMR signal produced thereby.

In one aspect of the present invention, a 180° rf inversion pulse is applied and the longitudinal magnetization is sampled along its recovery curve by a series of off-resonance spin-locking measurements. From this series of measurements the off-resonance relaxation time $T_{1\rho}$ is calculated.

A general object of the invention is to provide an accurate $T_{1\rho}$ measurement which can be performed very quickly. By sampling the recovery curve with a series of off-resonance spin-locking measurements, $T_{1\rho}$ can be measured quickly, and it is thus possible to make this measurement on each patient as part of a prescan sequence in which the optimal image contrast parameters $f_1/\Delta$ and TSL are determined. The $\theta$ and $-\theta$ pulses eliminate oscillations in the longitudinal magnetization curve so that an accurate measurement of $T_1$ can be made.

In another aspect of the invention a 180° inversion pulse is applied prior to the $\theta$ pulse and the NMR signal acquired following the $-\theta$ pulse is employed to reconstruct an image with $T_{1\rho}$ contrast between tissue types. In this application of the invention the $\theta$ and the $-\theta$ pulses eliminate oscillations in the longitudinal magnetization which might otherwise alter the amplitude of the acquired NMR signals and produce artifacts in the image reconstructed therefrom.

Another general object of the invention is to reduce artifacts in images produced using an off-resonance spin-locking pulse in a $T_{1\rho}$ contrast preparation sequence. By bounding the off-resonance spin-locking pulse with the $\theta$ pulses, the desired $T_{1\rho}$ contrast preparation is achieved without setting up oscillations in the longitudinal magnetization that might find their way into the acquired NMR signals.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

In the presence of a spin-locking pulse, the spin system behaves as if it were relaxing along the direction of the effective magnetic filed in the rotating frame of reference (Bell) with a relaxation time $T_{1\rho}$. This effective field $B_{\text{eff}}$ depends on the magnitude of the spin-locking pulse ($f_1 = YB_1/2\pi$ Hertz), and its offset from the Larmor resonance ($\Delta$ Hertz). The direction of the field $B_{\text{eff}}$ relative to the polarizing field is given by the following equation:

$$\theta = \text{Tan}^{-1}(f_1/\Delta) \qquad (1)$$

Because $B_{\text{eff}}$ is much smaller than the static polarizing field $B_0$ the relaxation time $T_{1\rho}$ is smaller than $T_1$ for a given tissue. The off-resonance relaxation time $T_{1\rho}$ for a given tissue depends on how far off-resonance the spin-locking pulse is, and the degree of off-resonance is determined by the ratio of spin-locking pulse amplitude to off-resonance ($f_1/\Delta$).

In conventional off-resonance spin-locking measurements the spin-locking pulse is far off-resonance ($f_1/\Delta << 1$) and $B_{\text{eff}}$ is aligned in substantially the same direction as the polarizing field $B_0$. As indicated in the above-cited copending U.S. patent application, however, maximum image contrast between tissue types may require spin-locking pulses which are not far off-resonance, but rather, with a $f_1/\Delta$ ratio of approximately 1. Such spin-locking pulses produce an effective field $B_{eff}$ which is tipped at an angle $\theta$ of about 45° and the usual assumption that $B_{eff}$ is directed along the polarizing field $B_0$ is far from correct. As a result, if the direction of $B_{eff}$ is not taken into account, oscillations occur in the magnitude of the longitudinal magnetization due to components therein which are perpendicular to the effective field $B_{eff}$.

Figure 4:
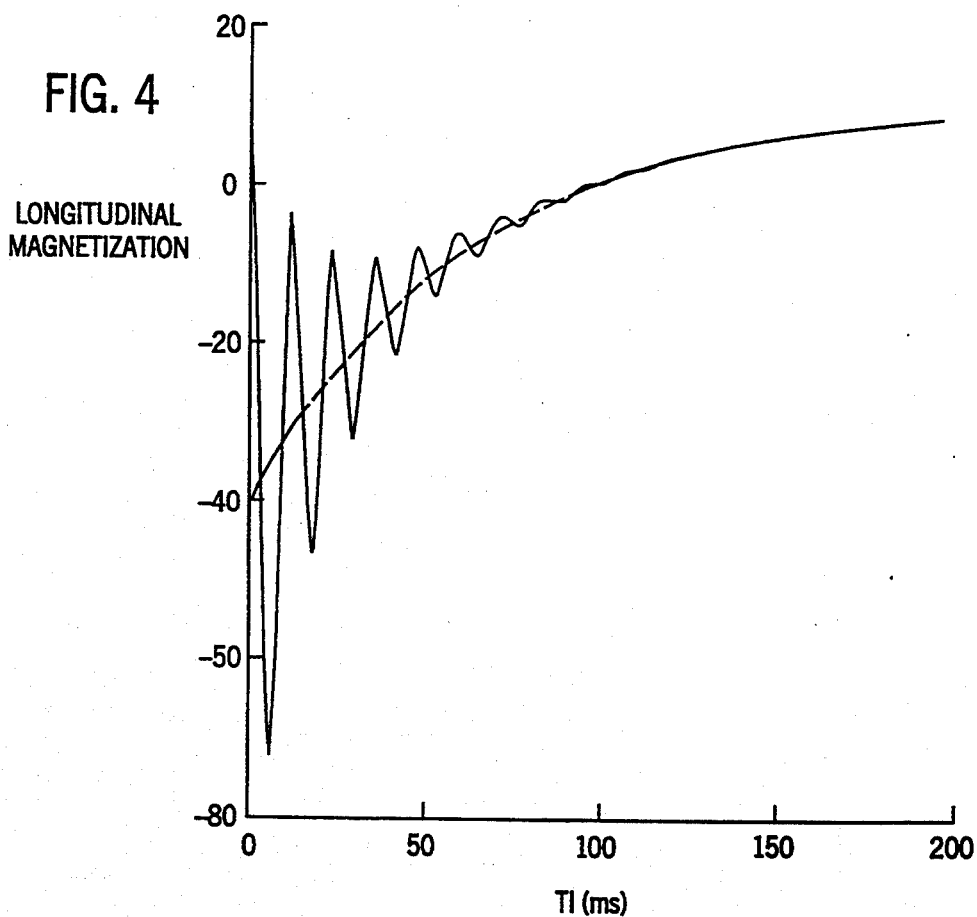
FIG. 4 is a graphic representation of the longitudinal magnetization recovery curve when an off-resonance spin-locking pulse is applied.
Figure 3A:
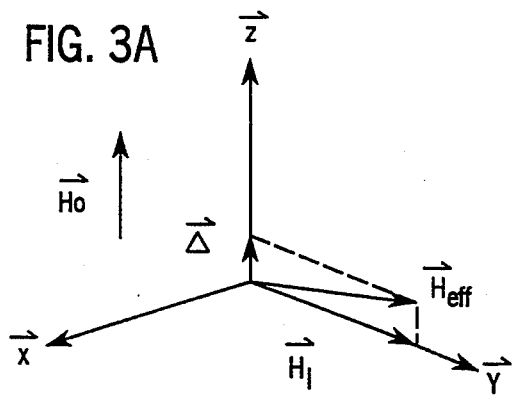
FIG. 3a and 3b are graphic representations of an NMR spin-locking experiment.
Figure 3B:
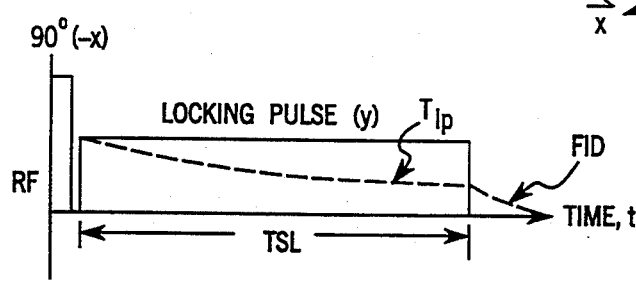

The solution to this problem is to tip the longitudinal magnetization by the angle $\theta$ prior to application of the off-resonance spin-locking pulse, and tip it back by the angle $-\theta$ afterwards. When applied to an inversion recovery measurement, for example, the longitudinal magnetization is inverted by the 180° rf inversion pulse, it is further tipped by a non-selective rf pulse having a flip angle of $\theta = \mathrm{Tan}^{-1}(f_1/\Delta)$, the off-resonance spin-locking pulse characterized by amplitude $f_1$ and off-resonance $\Delta$ is applied for the desired interval, and the longitudinal magnetization is tipped back by a second non-selective rf pulse having a flip angle of $-\theta = -\mathrm{Tan}^{-1}(f_1/\Delta)$. As a result, the longitudinal magnetization recovers along a smooth curve following inversion, as shown by the dotted line in FIG. 4.

As will now be described in detail, this improved off-resonance spin-locking method may be employed to quickly measure the relaxation constant $T_{1\rho}$, and it may be employed in an imaging pulse sequence to enhance tissue contrast by exploiting the $T_{1\rho}$ phenomena.

DESCRIPTION OF THE PREFERRED EMBODIMENT

Figure 1:
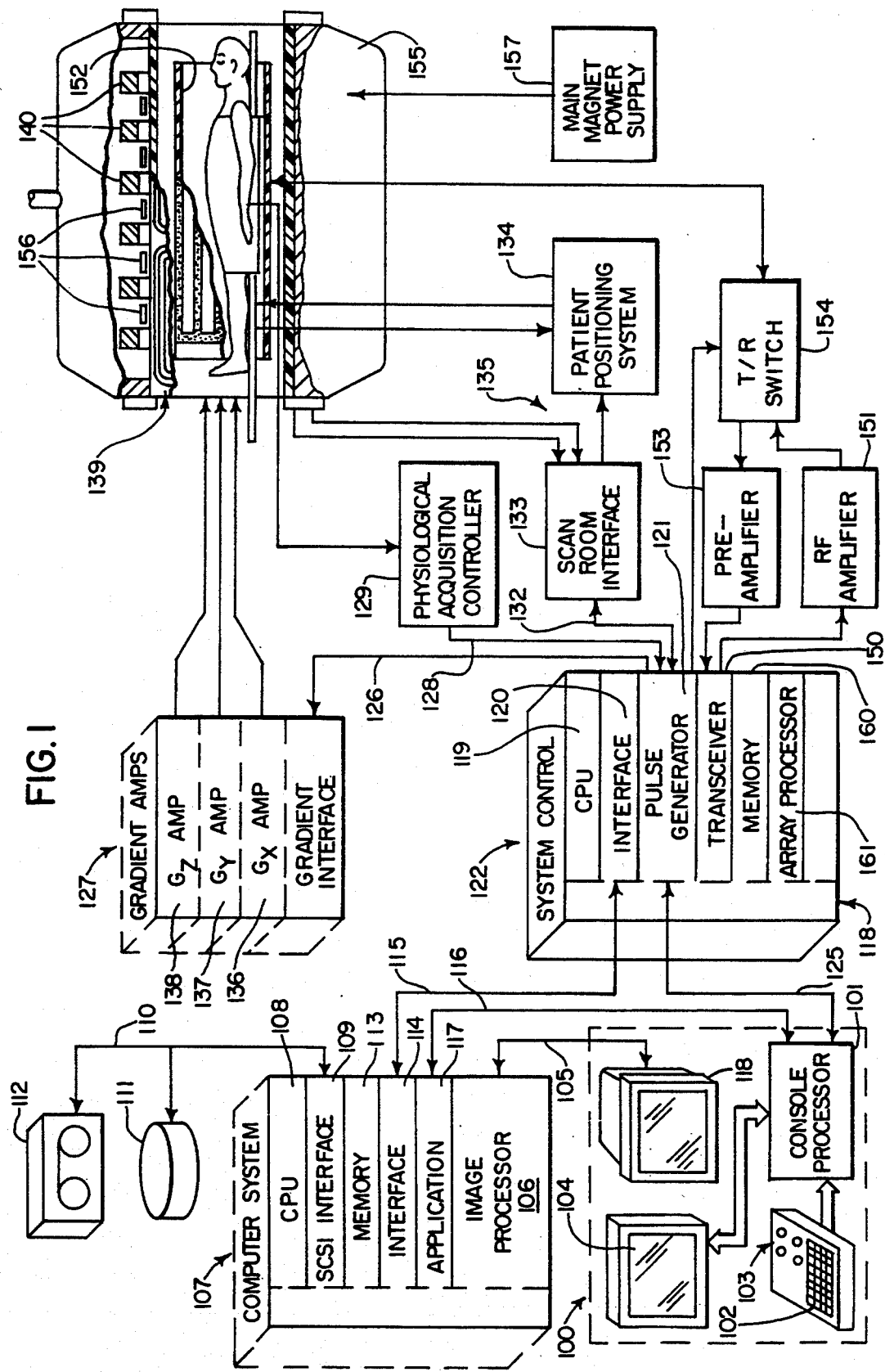
FIG. 1 is a block diagram of an NMR system which employs the present invention.

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103. The console processor 101 also drives a video display 104 to produce images. The data for these images is received through a serial link 105 from an image processor 106 that forms part of a separate computer system 107.

The computer system 107 is formed about a backplane bus which conforms with the VME standards, and it includes a number of modules which communicate with each other through this backplane. In addition to the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113, for storing image data arrays, and a serial interface module 114 that links the computer system 107 through a high speed serial link 115 to a system control 116.

The system control 116 includes a scan control module 117 and a series of modules which are connected together by a common backplane 118. The backplane 118 conforms to the VME standards and it is controlled by a CPU module 119. The serial interface module 120 connects this backplane 118 to the high speed serial link 115, and pulse generator module 121 connects the backplane 118 to the scan control module 117 through a link 122. The scan control module 117 is also connected to the operator console 100 through a serial link 125, and its is through this link that the system control 116 receives commands from the operator which indicate the scan sequence that it to be performed.

The scan control module 117 operates the system components to carry out the desired scan sequence. It conveys data to the pulse control module 121 which indicates the timing, strength and shape of the RF pulses which are to be produced, and the timing of and length of the data acquisition. The scan control module 117 also connects through serial link 126 to a set of gradient amplifiers 127, and it conveys data thereto which indicates the timing and shape of the gradient pulses that are to be produced during the scan. The scan control module 117 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the scan control module 117 that synchronizes the scan with the patient's cardiac cycle or respiratory cycle. And finally, the pulse generator module 117 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the scan control module 117 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) in the bore of the magnet assembly 155 is given by $B(x,y,z) = B_0 + G_x x + G_y y + G_z z$. The gradient magnetic fields are utilized to encode spatial information into the NMR signals emanating from the patient being studied.

Located within the bore 142 is a circular cylindrical whole-body RF coil 152. This coil 152 produces a transverse RF field in response to RF pulses provided by a transceiver module 150 in the system control cabinet 116. These pulses are amplified by an RF amplifier 151 and coupled to the RF coil 152 by a transmit/receive switch 154. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the scan control module 117 to electrically connect the RF amplifier 151 to the coil 152 during the transmit mode and to connect the preamplifier 153 during the receive mode. The transmit/receive switch 154 also enables a separate RF coil (not shown) to be used in either the transmit or receive mode.

In addition to supporting the polarizing magnet 140 and the gradient coils 139 and RF coil 152, the main magnet assembly 141 also supports a set of shim coil 156 associated with the main magnet 140 and used to correct inhomogeneities in the polarizing magnet field. In the case of a resistive magnet, a main power supply 157 is utilized to continuously energize the magnet 140 and in the case of a superconductive magnet, the main power supply 157 is utilized to bring the polarizing field produced by the magnet 140 to the proper operating strength and is then disconnected. In the case of a permanent magnet, power supply 157 is not needed.

The NMR signals picked up by the RF coil 152 are digitized by the transceiver module 150 and transferred to a memory module 160 which is also part of the system control 116. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be stored for later use in the disk memory 111, or archived on the tape drive 112. It may be further processed by the image processor 106, or it may be conveyed to the operator console 100 and presented on the video display 104.

Figure 2:
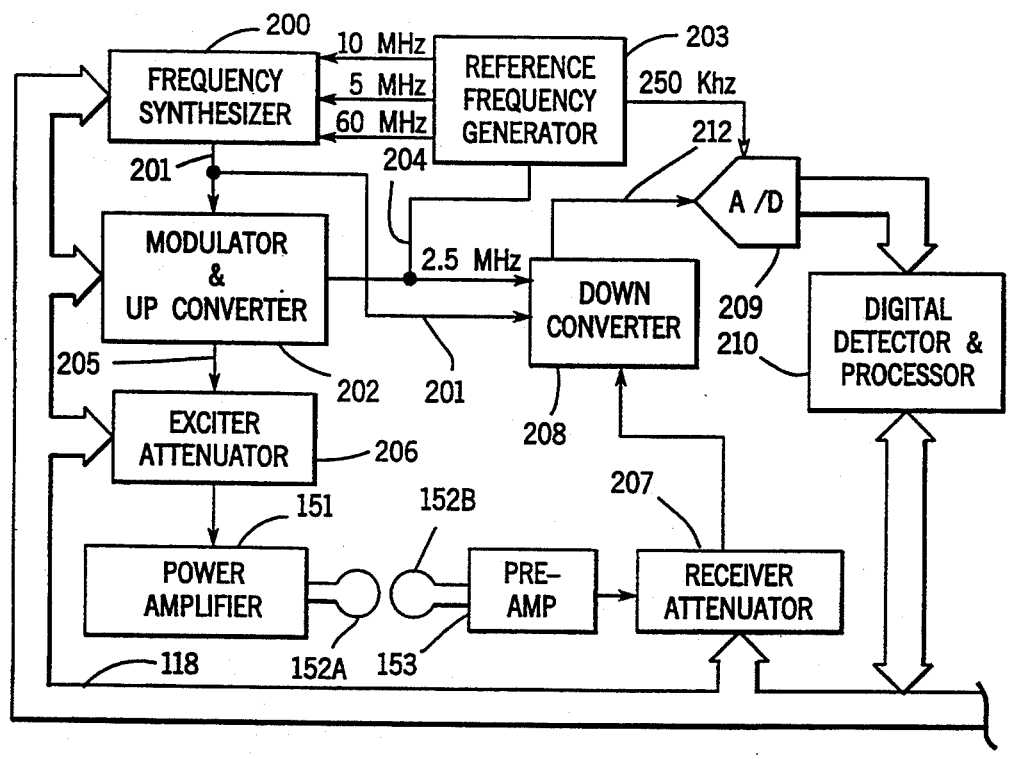
FIG. 2 is an electrical block diagram of the transceiver which forms part of the NMR system of FIG. 1.

Referring particularly to FIGS. 1 and 2, the transceiver 150 includes components which produce the RF excitation field $B_1$ through power amplifier 151 at a coil 152A and components which receive the resulting NMR signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) through the VME backplane 118 from the pulse control module 121. These digital signals indicate the frequency and phase of the RF carrier signal which is produced at an output 201. The commanded RF carrier is applied to a modulator and up converter 202 where it is modulated in response to a signal R(t) also received through the backplane 118 from the pulse control module 121. The signal R(t) defines the envelope, and therefore the bandwidth, of the RF excitation pulse to be produced. It is produced in the module 121 by sequentially reading out a series of stored digital values that represent the desired envelope. These stored digital values may, in turn, be changed from the operator console 100 to enable any desired RF pulse envelope to be produced. The magnitude of the RF excitation pulse output through line 205 is attenuated by a transmit attenuator circuit 206 which receives a digital signal, TA, from the backplane 118. The attenuated RF excitation pulses are applied to the power amplifier 151 that drives the RF transmitter coil 152A. For a more detailed description of this portion of the transceiver 112, reference is made to U.S. Pat. No. 4,952,877 which is incorporated herein by reference.

Referring still to FIG. 1 and 2 the NMR signal produced by the subject is picked up by the receiver coil 152B and applied through the preamplifier 153 to the input of a receiver 207. The receiver 207 further amplifies the NMR signal and this is attenuated by an amount determined by a digital attenuation signal (RA) received from the backplane 118. The receiver 207 is also turned on and off by a signal through line 211 from the pulse control module 121 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process by a down converter 208 which first mixes the NMR signal with the carrier signal on line 201 and then mixes the resulting difference signal with the 2.5 MHz reference signal on line 204. The resulting down converted NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation processes. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz master clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 5:
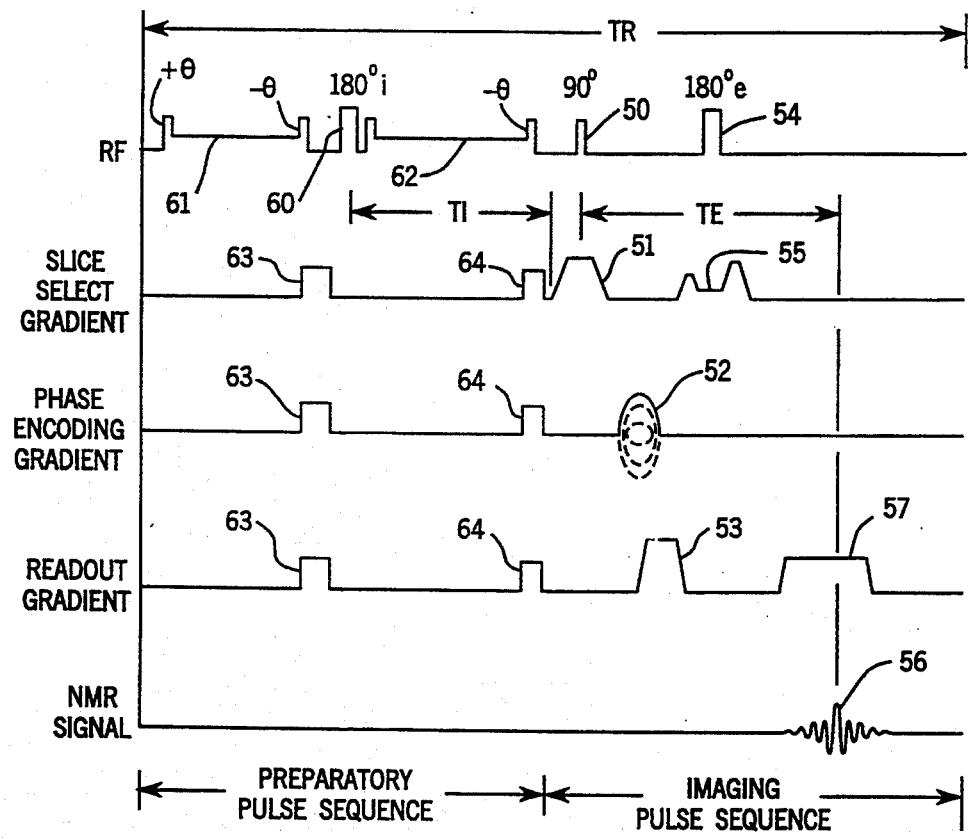
FIG. 5 is a graphic representation of the preferred embodiment of an imaging pulse sequence executed by the NMR system of FIG. 1 to practice the present invention.

One preferred embodiment of the present invention in an imaging pulse sequence is shown in FIG. 5. This pulse sequence is comprised of two parts: a preparatory pulse sequence and an imaging pulse sequence. The imaging pulse sequence is a conventional spin-warp sequence and the preparatory pulse sequence is a combination which will be described in more detail below.

Referring to FIG. 5, the imaging pulse sequence begins with the generation of a 90° RF excitation pulse 50 which is produced in the presence of a slice select magnetic field gradient 51. A phase encoding magnetic field gradient pulse 52 is then applied, as is a readout magnetic field gradient pulse 53. A 180° RF echo pulse 54 is then applied in the presence of a second slice select gradient pulse 55 and an NMR echo signal 56 is produced and acquired thereafter in the presence of a second readout gradient pulse 57. To minimize $T_2$ effects the echo time TE is kept to a minimum, which is 16 msec in the preferred embodiment. As is well known by those skilled in the art, each NMR echo signal 56 provides data for one "view" and a scan requires that this pulse sequence be repeated many times with different amounts of phase encoding 52 applied during each acquisition. In the preferred embodiment 256 samples are acquired during each acquisition of the NMR echo signal 56 and the phase encoding 52 is stepped through 128 discrete values. At the completion of the scan, therefore, a 256 by 128 array of NMR data has been acquired and this is employed to reconstruct an image by performing a complex two-dimensional, Fourier transformation on it.

While a spin warp imaging pulse sequence is described herein, many other imaging pulse sequences can be used and will benefit from the contrast enhancement of the present invention. For example, imaging pulse sequences such as echo-planar pulse sequences (EPI) described by Peter Mansfield (*J. Phys.* c.10:L55–L58, 1977); steady-state free precession pulse sequences (SSFP, GRASS, SSFP-ECHO) described by R.C. Hawkes and S. Patz (*Magnetic Resonance In Medicine*, 4, pp. 9–23, 1987); and fast spin echo pulse sequences (FSE, RARE) described by J. Hennig et al. (*Magnetic Resonance In Medicine*, 3, 823–833, 1986) can be used with the contrast preparation of the present invention.

Referring still to FIG. 5, the preparatory pulse sequence of the present invention includes a 180° RF inversion pulse 60 which is produced at a time interval TI before the start of the imaging pulse sequence. While this inversion recovery interval TI can be fine tuned to the particular anatomy being imaged, an interval of approximately 150 msecs works well when imaging the human breast.

Incorporated with the inversion recovery contrast preparation is an off-resonance spin-lock contrast preparation. This is achieved by applying a first off-resonance spin-lock RF pulse 61 and a second off-resonance spin-lock RF pulse 62. Both RF pulses 61 and 62 have the same amplitude which is set to produce about 0.025 gauss, or about one quarter the amplitude of the 90° RF excitation pulse 50. The resonant frequency offset of the spin-lock pulse can be fine tuned to achieve the desired contrast effect. For the human breast, the resonant frequency offset of the spin lock pulse is about 100 Hz. The duration (TSL$_2$) of the second spin-lock RF pulse 62 is constrained by the boundaries set by the inversion recovery period TI, and has a value from 120 to 130 msecs. when imaging the human breast. The duration (TSL$_1$) of the first spin-lock RF pulse 61 may be longer and a value of 200 msecs. is employed in the preferred embodiment. Contrast enhancement can be achieved with both spin-lock pulses 61 and 62 applied, or with only one of them applied. For example, when a multi-slice scan is being performed and SAR limits are a concern, only the first spin-lock RF pulse 61 need be applied. These pulses 61 and 62 are non-selective and therefore affect the spins in all slices simultaneously.

To suppress oscillations in the longitudinal magnetization as it recovers from the inversion pulse 60, $\theta$ and $-\theta$ pulses are produced before and after each off-resonance spin-lock pulse 61 and 62. The $\theta$ pulses are non-selective and they have a tip angle determined by the ratio $f_1/\Delta$ of the respective spin-lock pulses 61 and 62 as described above. For breast imaging the ratio $f_1/\Delta$ is approximately one and the $\theta$ pulses, therefore, have a tip angle of about 45°.

As with a conventional inversion recovery preparation sequence, gradient spoiler pulses 63 and 64 may be applied after each spin-lock RF pulse 61 and 62. These spoiler gradients dephase any transverse magnetization that may be produced during the intervals TSL$_1$ and TSL$_2$ and which might otherwise produce image artifacts.

Figure 6:
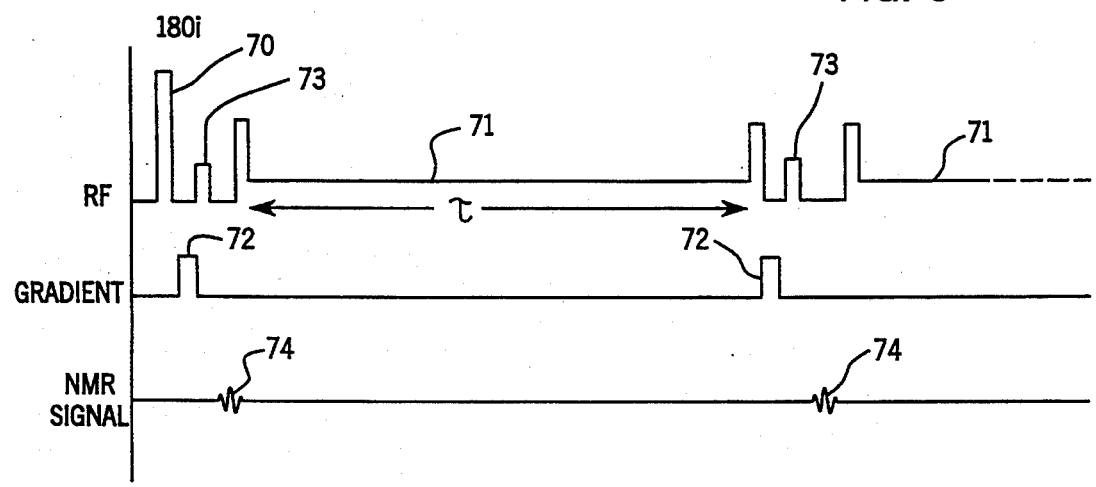
FIG. 6 is a graphic representation of the preferred embodiment of a pulse sequence for measuring the $T_{1\rho}$ relaxation time according to the present invention.

Referring particularly to FIG. 6, the present invention is particularly useful in a one-shot method for measuring the off-resonance relaxation constant $T_{1\rho}$. The measurement includes a 180° rf inversion pulse 70 which inverts the longitudinal magnetization in the well known manner. This is followed by a series of off-resonance spin-locking rf pulses 71 of duration $\tau$ interrupted by a sampling sequence for measuring the magnitude of the longitudinal magnetization. Each sampling sequence includes a spoiler gradient pulse 72 which dephases any transverse magnetization, followed by a small tip angle rf excitation pulse 73 that tips some of the longitudinal magnetization into the transverse plane where it produces a detectable NMR signal 74. Although only two samples are shown in FIG. 6, in the preferred embodiment eight samples of the relaxation curve are acquired. The small RF excitation pulses 73 have a tip angle $\alpha$ and the sampling sequence is very short (e.g. 12 milliseconds) as compared to the interval $\tau$ of the applied off-resonance spin-lock pulse 71 (e.g. 100 to 200 milliseconds). Thus, the spin-locking pulses 71 can be considered "on" for the duration of the recovery of the longitudinal magnetization, although a correction must be made to the measurement $T^*_{1\rho}$ to account for the sampling intervals. The equation relating true $T_{1\rho}$ to the measured $T^*_{1\rho}$ is as follows:

$$T^*_{1\rho} = \tau/[(\tau/T_{1\rho}) - ln(\cos\alpha)] \qquad (2)$$

Eight sample NMR signals 74 are acquired during each one-shot sequence, with one acquired immediately following the 180° inversion pulse 70 and seven acquired after the seven successive spin-locking pulses 71. The spin-locking pulse duration r is chosen such that the total duration of all seven pulses is equal to five times the expected $T_{1\rho}$ constant. This provides an adequate sampling of the relaxation curve from which a three-parameter least squares curve fitting procedure is used to estimate $T^*_{1\rho}$. The three-parameter equation used in this procedure is:

$$S = -\phi e^{-\tau/T^*_{1\rho}} + \beta \qquad (3)$$

where $\beta$ is the final longitudinal magnetization at $\tau = \infty$ and the quantity $\beta - \phi$ is the dynamic range of the magnetization relaxation curve. For measurement of breast tissues, each one-shot measurement sequence was repeated for several different resonance offset values ranging from $\Delta = 0.1$ to 10 kHz, while keeping the amplitude of the spin-locking pulses 71 constant at $f_1 = 100$ Hz.

The one-shot measurement sequence of FIG. 6 may be employed in an NMR spectrometer as a measurement tool for determining the off-resonance $T_{1\rho}$ relaxation time of various substances and tissues. In such an application sufficient data can be acquired and processed to arrive at the measured value of $T_{1\rho}$ in 3 to 6 seconds.

In another preferred embodiment of the invention measurement of the off-resonance relaxation constant $T_{1\rho}$ of in situ tissue is performed. In this application the basic one-shot measurement sequence of FIG. 6 is used, but the sampling sequence for measuring the longitudinal magnetization is a 2DFT gradient recalled echo pulse sequence. The spoiler gradient pulse 72 is employed and a slice selective rf excitation pulse is produced in the presence of a slice select gradient field pulse. This is followed by a phase encoding gradient field pulse and a readout gradient which is produced while the NMR signal 74 is produced. In this embodiment of the invention the one-shot measurement sequence is repeated 128 times with a succession of phase encoding gradient field values and the acquired NMR signals 74 are stored as eight 256 by 128 element arrays of k-space data. Each array of data is Fourier transformed along both dimensions in the conventional manner to produce eight 256 by 128 pixel images. The pixel (or pixels) of the in situ tissue to be measured is identified in one of the images and the corresponding pixels in the eight images are fit to the curve of equation (3) above to determine $T^*_{1\rho}$. Equation (2) above is then used to calculate the actual $T_{1\rho}$. This information can be used to set the parameters in the imaging sequence of FIG. 5 such that maximum $T_{1\rho}$ contrast is achieved in the identified tissue in a subsequent scan of the same patient.

We claim:

1. In an NMR system which subjects spins to a polarizing magnet field to produce longitudinal magnetization that precesses at a Larmor frequency and which subjects the spins to an off-resonance RF spin-locking pulse of amplitude $f_1$ and frequency offset $\Delta$ from the Larmor frequency, a method for reducing oscillations in the magnitude of the longitudinal magnetization which comprises:
   a) applying an RF field pulse to the spins prior to subjecting them to the off-resonance RF spin-locking pulse, said RF field pulse having a frequency at the Larmor frequency and having a tip angle $\theta$ determined by the relationship $\theta = \text{Tan}^{-1}(f_1/\Delta)$; and
   b) applying a second RF field pulse to the spins after subjecting them to the off-resonance RF spin-locking pulse, said second RF field pulse having a frequency at the Larmor frequency and having a tip angle $-\theta$.

2. A method for measuring the off-resonance relaxation time of a spin system, the steps comprising:
   a) applying a polarizing magnetic field to the spin system;
   b) applying a 180° rf inversion field to the spin system;
   c) applying a series of off-resonance spin-locking pulses of duration $\tau$ to the spin system;
   d) sampling the longitudinal magnetization of the spin system between off-resonance spin-locking pulses by acquiring NMR signals;
   e) calculating the off-resonance relaxation time ($T_{1\rho}$) of the spin system from the acquired NMR signals
   f) applying an rf field pulse to the spin system prior to each off-resonance spin-locking pulse having a tip angle ($\theta$) determined by the ratio of the off-resonance spin-locking pulse's amplitude ($f_1$) to its frequency offset ($\Delta$); and
   g) applying an rf field pulse to the spin system after each off-resonance spin-locking pulse having a tip angle of $-\theta$.

3. The method as recited in claim 2 in which the tip angle $\theta$ is determined by the relationship $\theta = \text{Tan}^{-1}(f_1/\Delta)$.

4. The method as recited in claim 2 in which step d) is performed by applying an rf excitation pulse of tip angle $\alpha$ to the spin system and acquiring the resulting NMR signal while applying a magnetic field gradient to the spin system.

5. The method as recited in claim 4 in which the acquired NMR signals are fit to a curve having a time constant $T^*_{1\rho}$, and the off-resonance relaxation time $T_{1\rho}$ is calculated by the relationship $T^*_{1\rho} = \tau/[\tau/T_{1\rho} - \ln(\cos\alpha)]$.

6. A method for producing an NMR image, the steps comprising:
   a) applying a polarizing magnetic field to spins located in a region of interest to produce precession in a selected spin species at a Larmor frequency $f_o$;
   b) applying a 180° RF inversion field pulse to the spins in the region of interest which is tuned to the Larmor frequency $f_o$;
   c) applying an RF field pulse to the spins in the region of interest which is tuned to the Larmor frequency $f_o$ and has a tip angle $\theta$;
   d) applying an RF spin-lock field pulse having an amplitude of $f_1$ to the spins in the region of interest, said RF spin-lock field pulse being tuned to a frequency which is offset by an amount $\Delta$ from the Larmor frequency $f_o$;
   e) applying an RF field pulse to the spins in the region of interest which is tuned to the Larmor frequency $f_o$ and has a tip angle $-\theta$;
   f) executing an imaging pulse sequence to acquire an NMR signal by applying an RF excitation field pulse to the spins in the region of interest at a time interval TI following the application of the 180° RF inversion field pulse and which is tuned to the Larmor frequency $f_o$; and
   g) reconstructing an image using the acquired NMR signal;
   wherein the tip angle $\theta$ is determined by the ratio of the Rf spin-lock field pulse's amplitude $f_1$ to its frequency offset $\Delta$.

7. The method as recited in claim 6 in which the tip angle $\theta$ is determined by the relationship $\theta = \text{Tan}^{-1}(f_1/\Delta)$.

* * * * *